United States Patent [19]

Smith

[11] 4,147,233

[45] Apr. 3, 1979

[54] TIMING CIRCUIT FOR A CHASSIS LUBRICATOR

[76] Inventor: Roy B. Smith, 3480 NE. 62, Washington Court House, Ohio 43160

[21] Appl. No.: 714,622

[22] Filed: Aug. 16, 1976

[51] Int. Cl.[2] .......................... F17D 3/00; H01H 3/26; F16N 11/10; F16N 13/16

[52] U.S. Cl. ................................ 184/29; 137/624.11; 328/129; 307/141

[58] Field of Search .......................... 184/29; 328/129; 307/141; 137/624.11

[56] References Cited

U.S. PATENT DOCUMENTS

| | | | |
|---|---|---|---|
| 1,866,206 | 7/1932 | Hajek | 184/29 |
| 1,914,900 | 6/1933 | Tarbox | 184/29 |
| 2,739,671 | 3/1956 | Edge et al. | 184/29 |
| 3,483,395 | 12/1969 | Sauber | 307/141 |
| 3,555,308 | 1/1971 | Peterson | 328/129 |
| 3,577,168 | 5/1971 | Tuten | 328/129 |

*Primary Examiner*—Samuel W. Engle
*Assistant Examiner*—Thomas H. Webb
*Attorney, Agent, or Firm*—Sidney W. Millard

[57] ABSTRACT

A solid state timing circuit exhibiting very high reliability under adverse environmental operational conditions such as are encountered in automatic truck lubrication systems. The circuit utilizes an electrochemical timing device operating in plate and deplate modes to achieve a periodic actuation of an inductive load. Two transistor stages are operatively associated with the electrochemical timing device and an R-C timing network is used to control one of these transistor stages.

5 Claims, 9 Drawing Figures

COMPRESSED GAS
LUBRICATION SITE
LUBRICATION SITE
LUBRICATION SITE
LUBRICATION SITE

TIMING CIRCUIT FOR A CHASSIS LUBRICATOR

BACKGROUND

Heavy machinery, motor vehicles and like major mechanical equipment, for the most part, are manually lubricated at a plurality of critical sites or points in accordance with published schedules of their manufacturer or industrial user. These schedules generally designate the frequency of such lubricative maintenance and the amount of lubricant to be applied as well as the noted sites of application. Where grease is the designated lubricant, a failure to perform scheduled maintenance not only places the operational capability of the machinery in jeopardy due to the frictional association of components, but also permits grease-type lubricants to commence to break down. In the latter regard typical grease-type lubricants comprise admixtures of oil and "soap," for instance an alkali metal such as lithium.

When permitted to remain without replenishment at a lubrication site over an extended interval of time, such lubricants degenerate to lose their lubricating ability and hinder mechanical performance. Due to the vagaries attendant with all scheduled manual maintenance schemes, due regard for the "human element" has prompted industry to look to automated lubrication. When incorporated, for instance, in tractor-trailer rigs, automated lubrication systems promise to extend the operational usefulness of mechanical components with an attendant realization of economy both from the standpoint of extended life spans and in a lowering of maintenance labor costs.

Of course, to remain effective, the automated lubrication system, itself, must be capable of operation under very high standards of reliability. For instance, the lubricant delivery system addressed to critical points of lubrication should be immune from overall breakdown due to an isolated breakage of, for example, only one of the delivery lines or the like. The reservoir from which the lubricant is dispensed should provide for sure delivery of lubricant to dispensing pumps and the like and remain isolated from harsh environments which may be encountered under highway conditions. Additionally, the dispensing pumps should incorporate a capability for dispensing predetermined amounts of lubricants to designated sites or locations. For instance, for a given type of equipment, certain groupings of these sites will require a greater quantity of lubricant than others. Further, the machinery and distribution system should exhibit high mechanical reliability over periods of extended performance.

Where electro-mechanical actuating techniques, for example, arrangements incorporating solenoid drives and the like, are utilized within the systems for purposes of actuating valves utilized, in turn, to control compressed air inputs to components, techniques are required for assuring the reliable performance of such valves themselves. The moving components of these valves should be periodically lubricated to assure their uninterrupted performance.

With the utilization of desirable electronic logic circuits for providing periodic actuation of the dispensing components of the systems, the noted reliability requirements carry over the such circuits themselves. While solid-state design techniques are available to provide extended circuit component lifespans, additional protective considerations arise. For example, where solenoid actuated valving is contemplated within a circuit design, the inductive loading nature of the devices normally will generate voltage surge phenomena which, without some form of protection, may deleteriously affect logic circuit components. Accordingly, considerations for long-term reliability of the electronic controls require appropriate accommodation for such phenomena.

SUMMARY

The present invention is addressed to a system and apparatus for periodically dispensing lubricant through a plurality of conduits extending to predetermined sites within a mechanism, for instance, tractor-trailer type vehicles and the like. By automatically dispensing predetermined quantities of lubricant to critical lubricating sites within the mechanisms in accordance with an optimised time-based program, important improvements in the effective operational life span of such equipment may be realized.

By incorporating a reservoir mounted for movement with the equipment which provides a lubricant-retaining capacity suited for a relatively extended operational period, for example about 30,000 miles in the case of truck-type vehicles, optimised lubricative maintenance is assured with the somewhat simple maintenance procedure of filling the reservoir at the commencement of operation. An important aspect of the invention resides in the provision of apparatus, the design of which is inherently reliable in and of itself, such that equipment owners are afforded high assurances against equipment shutdown due to lubrication failure. In this regard, both the apparatus of the system physically dispensing the lubricant to each site is inherently reliable as well as the control system for periodically actuating this apparatus in accordance with a pre-programmed schedule.

As a feature and further object of the invention, there is provided a system of the type described including a housing which is mountable in the vicinity or upon the mechanism to be lubricated. This housing supports a reservoir arrangement having a capacity for retaining a predetermined initial quantity of lubricant. Within the housing is mounted a pump for drawing a predetermined quantity of the lubricant from the reservoir and dispensing predetermined amounts of this lubricant under pressure. The housing further incorporates a distributor arrangement which communicates with the outlet of the pump to receive the dispensed lubricant. By selectively incrementally assuming a plurality of orientations, this distributor provides a passageway which communicates the pump with selected ones of the conduits leading to the lubrication sites in accordance with an optimum lubrication program. A drive arrangement also is mounted upon the housing for actuating the distributor and a control arrangement is provided which regulates the pump to achieve the noted periodic actuation.

Another feature and object of the invention provides for the retention of the lubricant within the reservoir essentially at atmospheric pressure, no pressurization being required within the reservoir itself to assure the conveyance of the lubricant therein to the pumping function of the apparatus. This is carried out by incorporating certain of the actuating components of the system within the lower surface of the reservoir itself. Thus situated within the lubricant environment of the reservoir, these components periodically exert a shear action upon the lubricant within their immediate vicinity to assure proper delivery thereof to the inlet of the pump without recourse to the use of undesirable lubricant pressurization techniques.

In another aspect, the invention provides an actuator arrangement for the noted distributor which combines a reciprocative drive moveable in one direction to index the distributor between its dispensation orientations and a compressed gas drive to cause it to return to a pre-engagement or standby position. With such an arrangement, the forces exerted upon the distributor are of a relatively gentle nature, thereby assuring continued reliable performance over long periods of time. A further feature of this drive arrangement provides a bifurcated stem and ratchet structure which is configured to be self-aligning, again assuring reliable and continued operation over extended periods of time.

Another object of the invention is to provide apparatus of the type described wherein metering of the amount of lubricant dispensed from the pump within the housing of the device is provided through a cam situated upon and rotating with the noted distributor operating in conjunction with a stem or extension connected with the pump piston. Thus arranged, the stem limits the extent of travel of a positive displacement pump configuration to selectively control the amount of lubricant dispensed for any given actuation. By permitting flecture of this stem as it directly abuts the cam, no interference is occassioned between the stem and cam as the rising profile portions of the cam move into juxtaposition with portions of the stem. Here again, a feature providing for high reliability of operation of the lubricator is provided.

Another object and feature of the invention looks to the reliability of those components of the lubricator system and apparatus which serve to provide actuating forces to the above described pump and distributor arrangement. Compressed gas preferably is utilized to actuate these components, the control over such gas introduction thereto being effected by a solenoid actuated valve mounted upon the housing of the dispensing apparatus. Because the gas conveying conduits from this valve are commonly associated with both the distributor and the lubricant dispensing pump, a small amount of the lubricant is permitted to migrate therethrough so as to effect a continual lubrication of both the valve components and the drive components of the system. Here again, the reliability of the entire system is improved through the enhancement of performance of valving and drive components through continuous lubrication thereof.

Another object of the invention is to provide an internally contained venting arrangement for the noted reservoir of the lubricator-distributor apparatus wherein a conduit extends into a closed cavity above the filling level of the lubricant and communicates with a chamber within the housing substantially immune from contaminating materials encountered in normal operation but communicating with the atmosphere. This vent, operating in concert with the noted shearing activity of the moving components located within the lubricant reservoir environment itself, provides for assured delivery of uncontaminated lubricant within the distribution conduits of the entire system.

As another object and feature of the system, a timing control is provided for selectively actuating the noted value arrangement to regulate the lubricator apparatus. This actuation is carried out through the select periodic energization of the inductive load or winding of a solenoid valve drive. The control circuit providing this selective timed energization itself is protected from voltage surges or excursions occassioned through the energization of such inductive load by a unique voltage regulating arrangement. For instance, the control incorporates first and second power leads which are connectible with the source of current as well as a switching arrangement coupled with one such power lead and having an output connected with the inductive load and the other of the power leads. A logic network is provided within the timing device which is coupled between the first and second power leads for controlling the switching arrangement. Voltage regulation over the entire circuit is provided which includes a transistor stage having its emitter coupled to the first power lead of one designated polarity while its base and collector are coupled to the second of the power leads of a designated polarity opposite to the one noted above. A current limiting resistor is coupled in series circuit relationship with one of the power leads. The noted transistor stage then is arranged to be responsive to transient voltages or surges at the second power lead of one designated polarity derived from the inductive load to transmit this transient voltage to the first or other power lead so that any deleterious voltage drops occasioned by the presence of that transient voltage are substantially diminished. Preferably, this transistor stage of the voltage regulator comprises a monolithic NPN transistor. Additionally, the noted current limiting resistor is incorporated within the one power lead at a location intermediate to the inductive load and the logic network connection with that power lead.

Another object of the invention is to provide a timing device for periodically energizing the noted load from a source which includes the noted switching arrangement which responds to a given input condition to effect the energization of the solenoid winding. Logic network means then are provided including an electro-chemical timing device which exhibits, from an initial condition thereof, a conductive state over a predetermined first interval upon the passage of a predetermined value of current therethrough in a designated first directional sense. This condition obtains, for instance, for an interval which may be selected for truck-vehicle usage of about 6 minutes. The timing device exhibits a substantially non-conductive state to the current of the first directional sense at the termination of such interval and it is further responsive to the passage of current of predetermined value therethrough in a second directional sense to transition from the non-conductive to the initial state within a predetermined second interval of time. A first transistor stage, operably associated with the switching means and the timing device which has a conducting mode deriving the noted switch condition when the timing device is in the non-conducting state is provided. This first stage also exhibits a non-conducting mode when the timing device is in its conductive state. A second transistor stage additionally is provided which is operatively associated with the noted timing device and is responsive to a given input condition to exhibit a conducting mode for effecting current passage in the noted first directional sense to derive the timing device conductive state described above and has a non-conducting mode during the passage of current in the earlier discussed second directional sense through the timing device. Additionally, the timing circuit includes an R-C timing network for deriving the given input condition to that second transistor stage at the termination of a predetermined second interval commencing with the termination of the first interval. That second interval, for typical truck-vehicle usage, is selected as around 4–5 seconds.

Other objects of the invention will, in part, be obvious and will, in part, appear hereinafter.

The invention, accordingly, comprises the apparatus and system possessing the construction, combination of elements and arrangement of parts which are exemplified in the following detailed disclosure.

For a fuller understanding of the nature and objects of the invention, reference should be had to the following detailed description taken in connection with the accompanying drawings.

DETAILED DESCRIPTION

Figure 5:
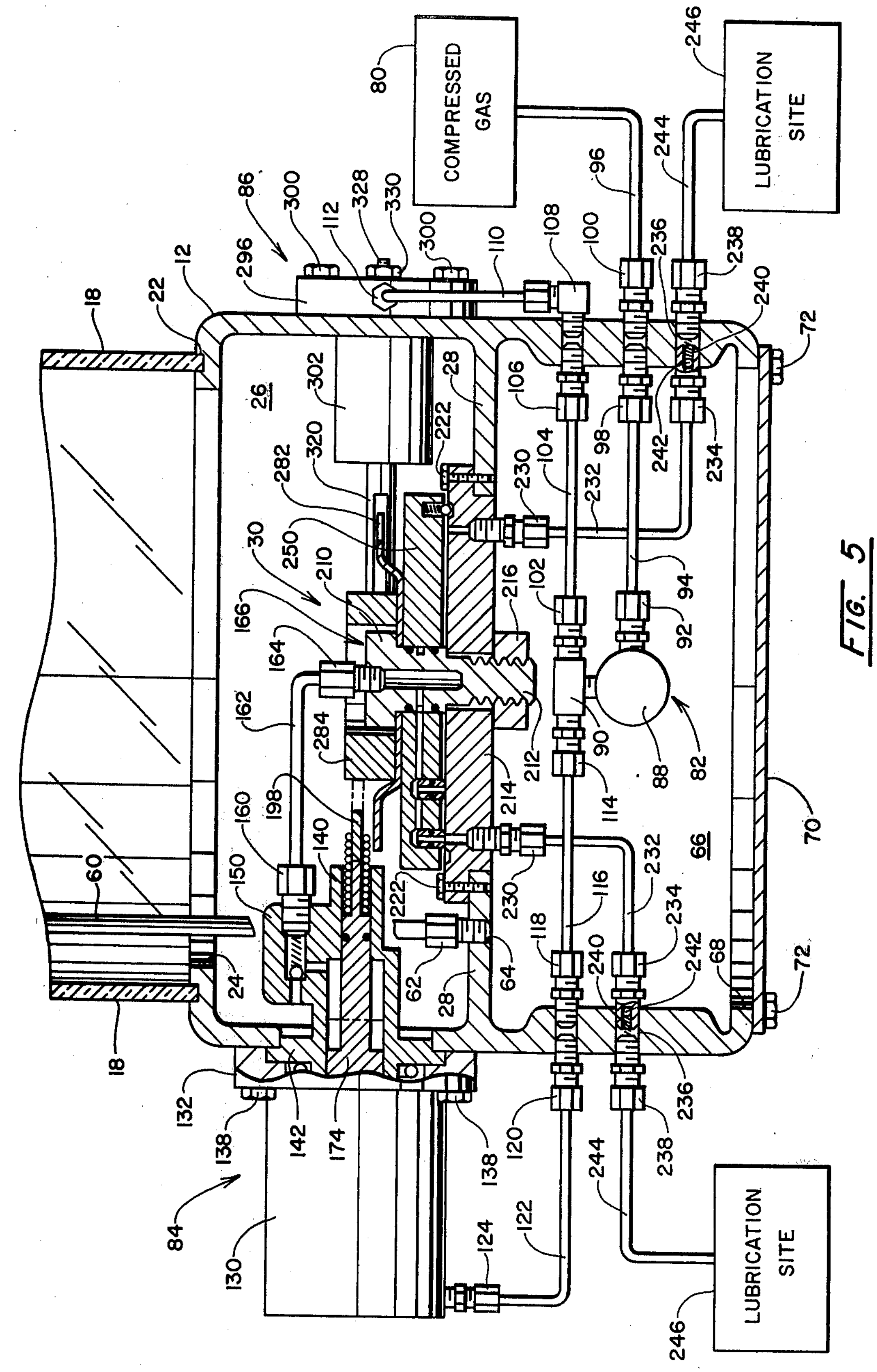
FIG. 5 is a sectional view of the lubricating apparatus of the invention taken through the plane 5—5 of FIG. 2.

The lubricating system of the instant invention is one which uniquely periodically dispenses lubricant, for instance, to lubrication sites within a typical tractor-trailer, from a central lubricant containing reservoir. However, this reservoir is not retained under pressure, the lubricant being pressurized in the course of its exit from the reservoir, whereupon it is dispensed through select ones of conduits to various lubricating sites. Looking to FIG. 1, this reservoir arrangement and the general dispensing apparatus of the system is revealed at 10. Apparatus 10 includes a generally rectangularly shaped housing 12 which, for example, may be cast from aluminum or other suitable material appropriate for the rigorous environment, for instance, encountered in highway travel. Housing 12 is attached at a convenient location upon the vehicle which is periodically lubricates by connection therewith through threaded studs 14 fixed within and extending from corresponding boss components 16 of housing 12. Standing upon and extending upwardly from housing 12 is a tubular shaped reservoir wall 18. Wall 18 may be formed of a transparent plastic such that the level of lubricant retained therein, as portrayed by line 20, may be readily ascertained visually by the operator. As is revealed more clearly in FIG. 5, tubular reservoir wall 18 nests within an annular groove 22 machined or suitably formed within the upper surface of housing 12. This groove 22 surrounds a corresponding annular inner opening, the edge of which is revealed at 24. FIG. 5 further shows that the lubricant retaining reservoir portion of apparatus 10 extends through the opening defined by edge 24 and includes the upper cavity 26 of housing 12. In this regard, note that the bottom of cavity 26 is formed by a casting extension or web 28 which, in turn, supports a distributor represented generally at 30.

Figure 1:
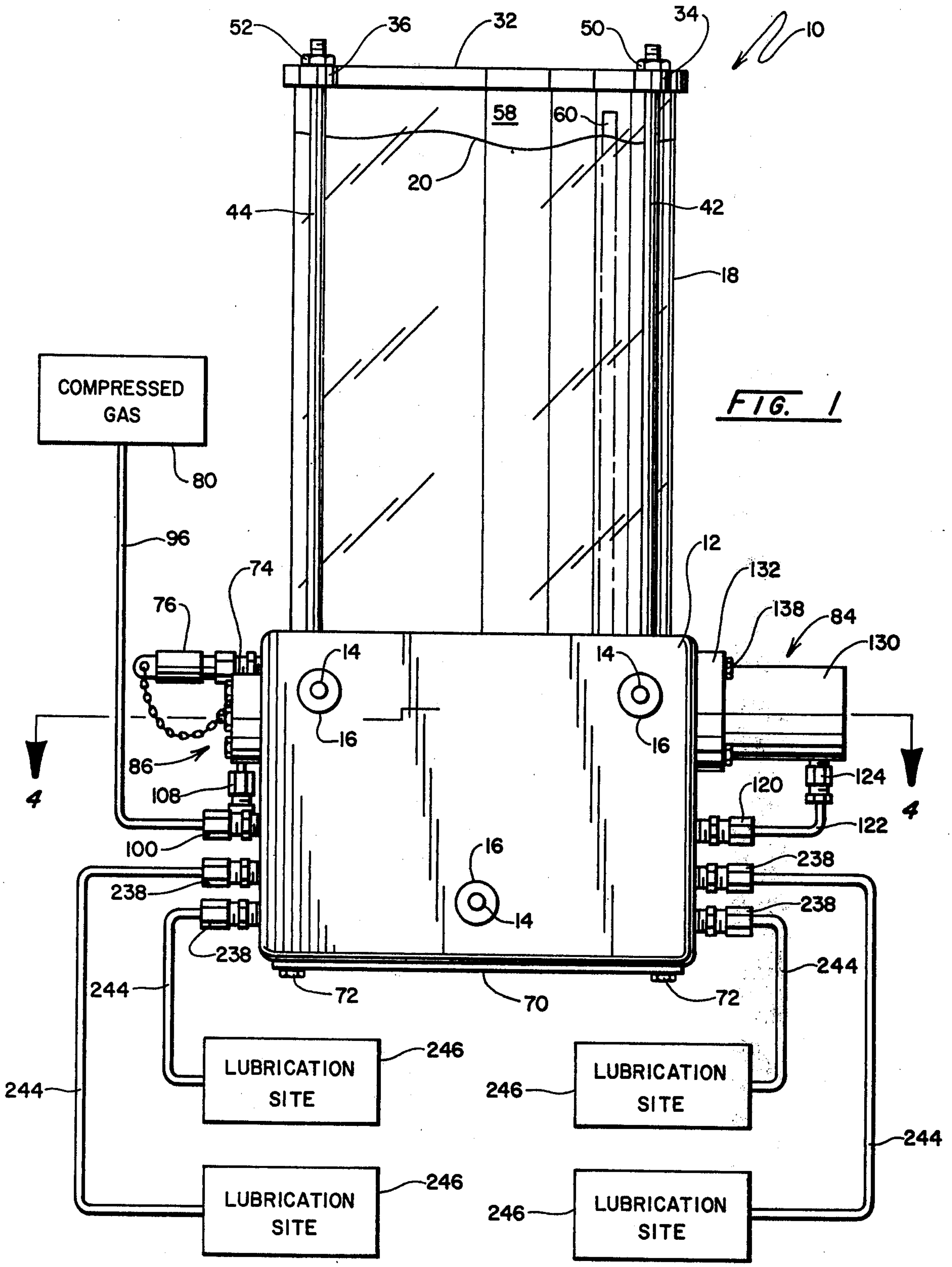
FIG. 1 is a side elevational view of lubricating apparatus according to the system of the invention, the figure depicting lubrication sites and a source of compressed gas in block schematic form.
Figure 2:
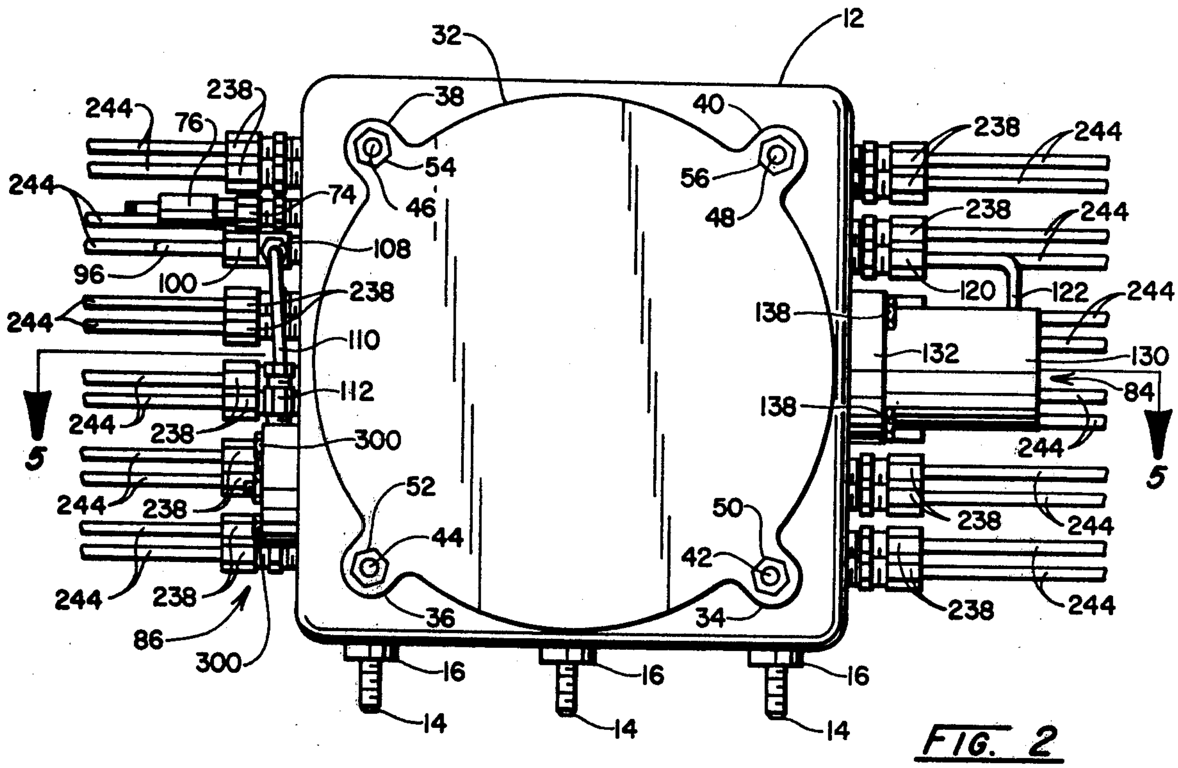
FIG. 2 is a top view of the lubricating apparatus of FIG. 1.

Returning to FIGS. 1 and 2, the lubricant retaining reservoir extends upward, as defined by reservoir wall 18, to terminate in a cap 32 which nests thereover by virtue of a groove (not shown) having a radius matching that of wall 18. Cap 32 may be formed by conventional casting procedures or the like and as is revealed additionally in FIG. 2 is fashioned having four outwardly extending ear portions 34–40 which are drilled to receive the end portions of corresponding tension or attachment rods 42–48. Rods 42–48 are threadably connected to corresponding tapped bores (not shown) in the upper surface of housing 12 and retain cap 32 in position by virtue of the threaded connections therewith of nuts 50–56. With the arrangement shown, tubular wall 18 is properly retained as well as readily removed to permit access to components within cavity 26, and where desired, to permit bulk loading of lubricant therewithin.

An important feature of the reservoir arrangement of the apparatus resides in the provision of venting to the enclosed air space 58 above lubricant level 20. Venting to the atmosphere is provided by a vent tube 60 having one opening extending within space 58 and the opposite end of which is coupled to web 28 (FIG. 5) by a fitting 62. Fitting 62 is threadably coupled to a tapped bore 64 formed within web 28. Bore 64, in turn, extends to a lower cavity 66 of housing 12. Cavity 66 is configured to have a rectangular opening along its lowermost side, the periphery of which is revealed at 68. This opening is covered by a bottom plate 70 which is secured to housing 12 by bolts or the like, as at 72. With the structure shown, venting is provided through tube 60 to air space 58 through the enclosed lower cavity 66. However, by virtue of the connection of bottom plate 70 across the opening defined by edge 68, atmospheric air available within cavity 66 is effectively filtered from contaminants otherwise encountered in conventional highway operational environments and the like.

With the reservoir arrangement thus described, the lubricant therewithin is permitted to flow downwardly within the reservoir unaffected by lower pressures which otherwise might be developed within air space 58. Of particular importance, however, inasmuch as the lower portion of the reservoir incorporates such elements as distributor 30 as well as other actuated and moving components to be described in detail later herein, a shearing action is imparted at the lower surface of the reservoir from which lubricant is drawn for dispensation. By virtue of the thixotropic nature of conventional greases and the like, this shearing activity assures proper gravitational movement of lubricant or grease into a pump input port during the operation of the device. Further, this necessary manipulation of the lubricant is carried out without the utilization of pressurization techniques and the like imposed upon the reservoir itself. For convenience of filling the reservoir with lubricant, a conventional double valve quick-disconnect fitting 74 along with cap 76 is shown in FIG. 1 as extending through housing 12 and into cavity 26. With the presence of fitting 74, as the vehicle on which the apparatus 10 is moved into a service area, the attendant need only attach a grease dispensing device to fitting 74 to carry out reservoir filling operations. Note that vent 60 also facilitates the filling operation by preventing back pressures within the reservoir environment.

Figure 6:
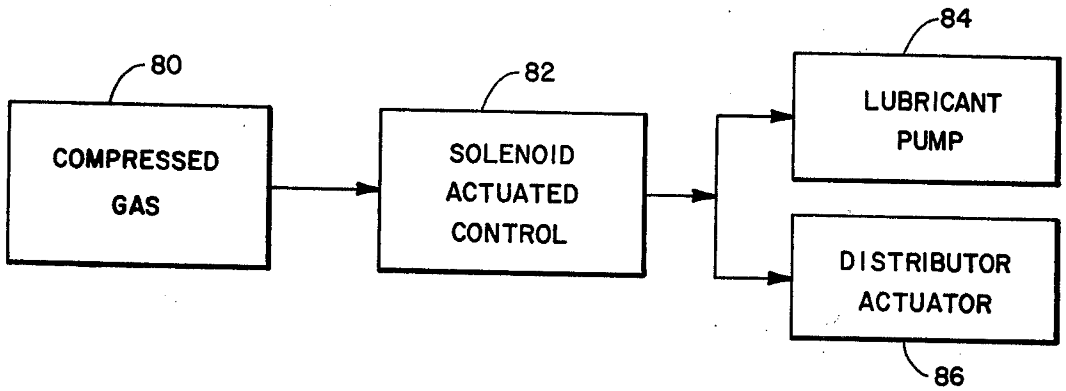
FIG. 6 is a block schematic representation of the system of the invention.

Turning now to the dispensing operation of the apparatus, reference initially is made to FIG. 6 wherein a general schematic representation of the operation of the system is revealed. A source of compressed gas, i.e. air, as is conveniently available for tractor-trailer installations and the like is utilized as a drive source. This source is represented in the figure at block 80. Gas under pressure is delivered from source 80 to a solenoid actuated control arrangement revealed at block 82. Controlled air or gas under pressure is selectively delivered to a lubricant pump function shown at block 84, as well as to a distributor actuator function, shown at block 86. Functions 82, 84, and 86, additionally, are represented in FIG. 5 to generally designate the vicinity of the components constituting these functions.

Referring to FIG. 5, the solenoid actuated control function 82 is shown to include a solenoid actuated three-way valve represented at 88. Such valves as at 88 are conventionally available, for instance that designated as "Model M-32" marketed by Acorn Products Corp. of East Hanover, New Jersey may be utilized for the purpose at hand. Valve 88 is connected to one side of housing 12 within cavity 66. A "T" connector 90 is coupled to the output port of valve, 88, while compressed gas or air from source 80 is introduced thereto through threaded connector 92, tube 94 and tube 96. Tubes 94 and 96 are interconnected through the wall of housing 12 by connectors 98 and 100 which are threadably engaged therewith through a tapped bore passing through the side thereof. Valve 82 also incorporates a relief port (not shown) the function of which will become apparent as the description of its operation unfolds. The commonly associated ports of "T" connector 90 are coupled, for instance, through a fitting 102, tube or conduit 104, fittings 106 and 108, connected within a common tapped bore in the wall of housing 12, and tube 110 to the input fitting 112 of distributor-actuator function 86. Similarly, the opposite side of connector 90 is coupled through fitting or connector 114, tube 116, fittings 118 and 120, tube 122 and fitting 124 to lubricant pump function 84. Connectors or fittings 118 and 120 are commonly connected to a tapped bore passing through an opposite side of housing 12 and communicating with lower cavity 66. As is apparent, upon appropriate actuation of valve 88 by selective energization of the solenoid drive thereof, compressed gas is permitted to communicate for a select interval with functions 84 and 86.

Figure 4:
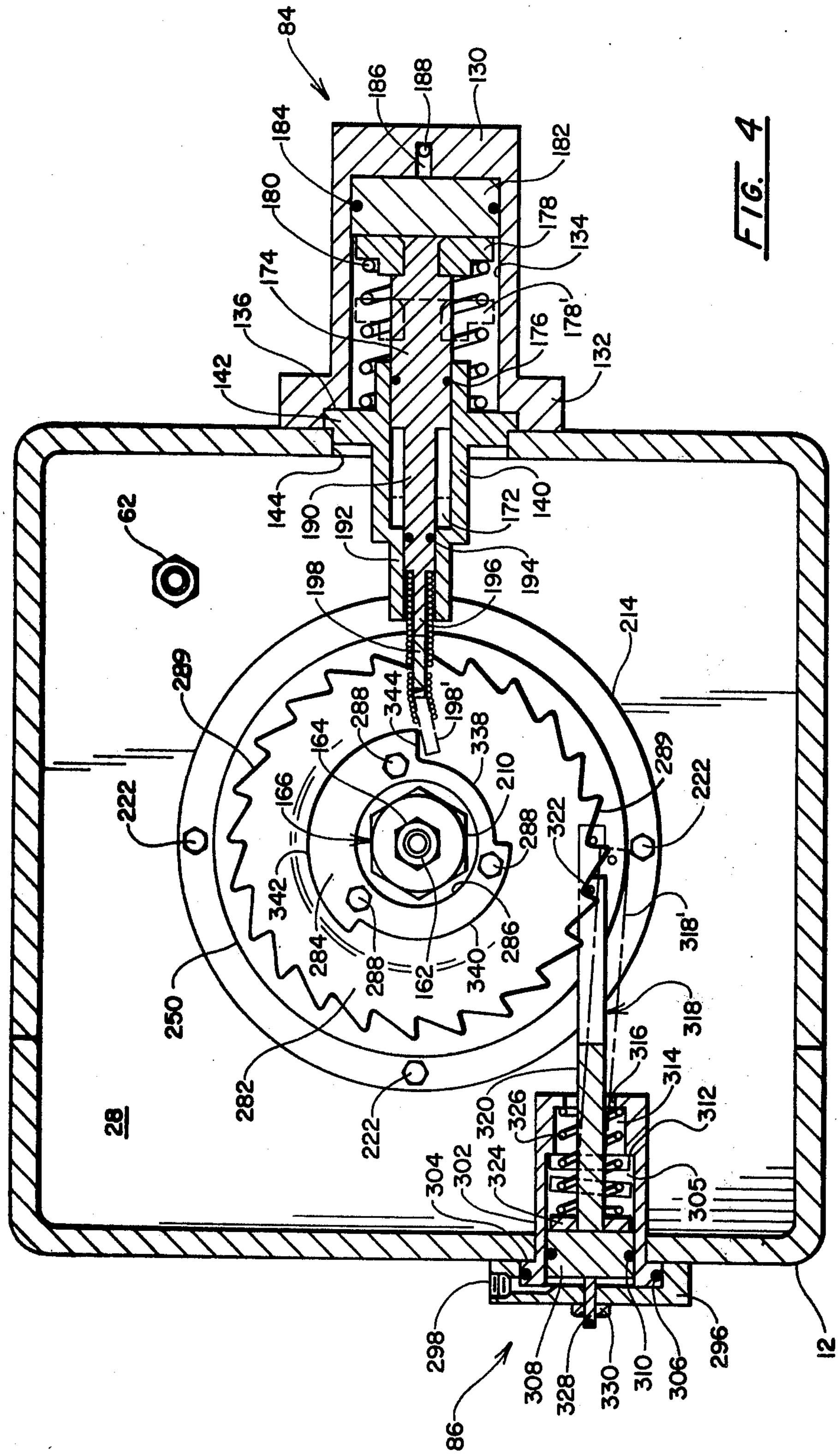
FIG. 4 is a sectional view of the lubricating apparatus taken through the plane 4—4 of FIG. 1.
Figure 5A:
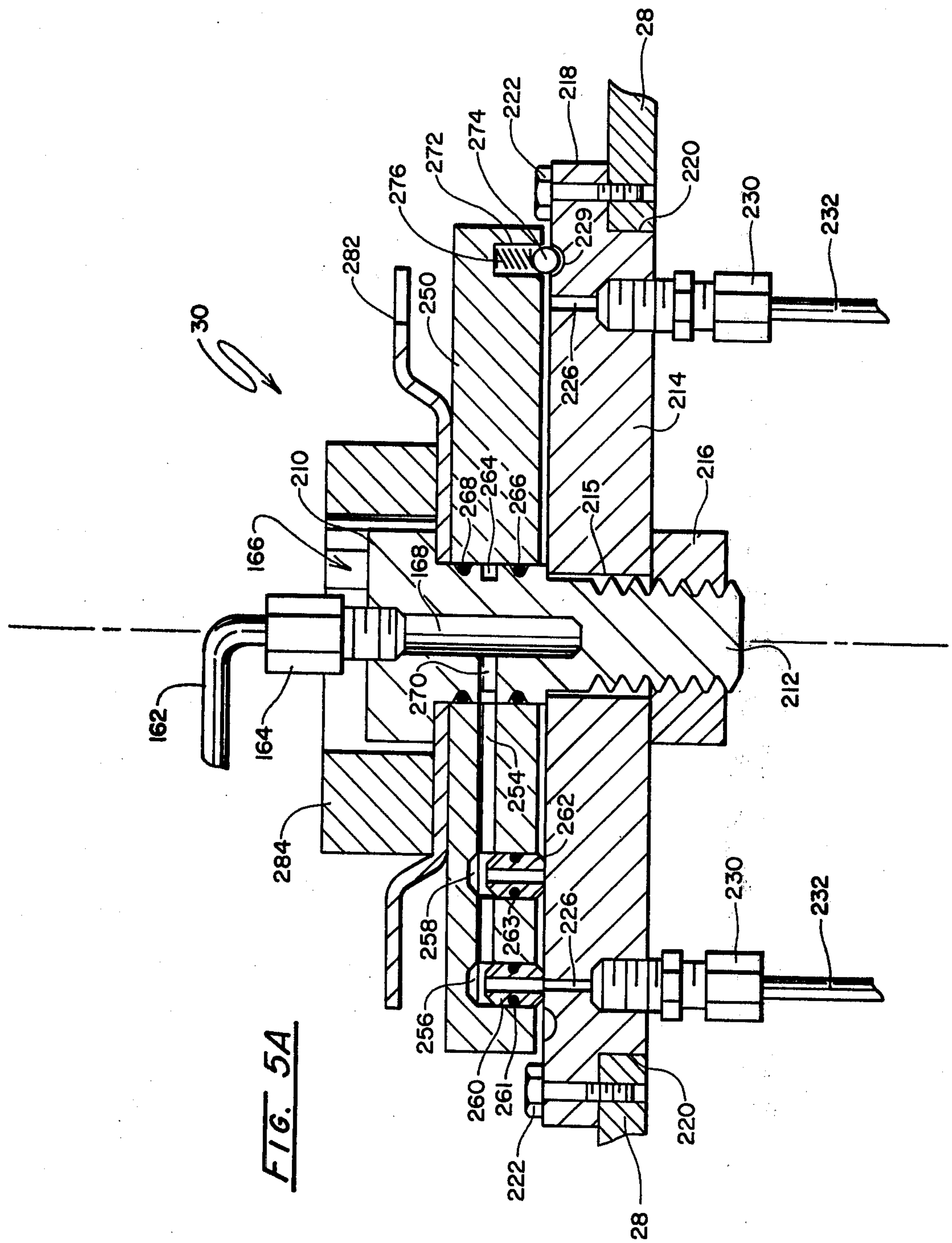
FIG. 5A is an enlarged partial and sectional view of one feature of the apparatus of the invention revealed in FIG. 5.

Looking now in more detail to the lubricant pumping function 84 and referring to FIGS. 4, 5 and 5A, pumping function 84 is revealed as a positive displacement type pump driven in one directional sense by compressed gas and in a sense opposite thereto by a spring bias. The pump assembly comprises a drive cylinder 130 having a generally cylindrical outer peripheral configuration including an outwardly extending flange portion 132 and an inwardly disposed cylindrical bore 134 (FIG. 4). Cylinder 130 further is configured having an annularly shaped and inwardly disposed seat or counter-bore 136. The cylinder 130 is connected with an outer surface of housing 12 by bolts as at 138 (FIG. 5) extending through flange portion 132 and threadably engaging corresponding tapped bores within housing 12. A pump body 140 is positioned within cavity 26 and communicating with cylinder 130. Pump body 140 generally may be fabricated by casting and finish machining and is formed incorporating an annular shaped seating flange portion 142, one surface of which nests against and is supported by the correspondingly shaped seat 136 of drive cylinder 130. As is apparent from the drawings, the oppositely disposed annular surface of flange portion 142 rests against the outer surface of housing 12 and the combined assemblage of drive cylinder 130 and pump portion 140 thereby is supported upon housing 12 by virtue of the connection of bolts 138. Of course, this connection is such as to assure the lubricant retaining integrity of upper cavity 26 of the lubricant reservoir. Note that the seating flange portion 142 fits or nests within a corresponding bore 144 formed within a side of housing 12 communicating with upper cavity 26. The reasonably achieved tolerances at this fit as well as the flange construction provides the noted integrity of that portion of the reservoir.

Figure 5B:
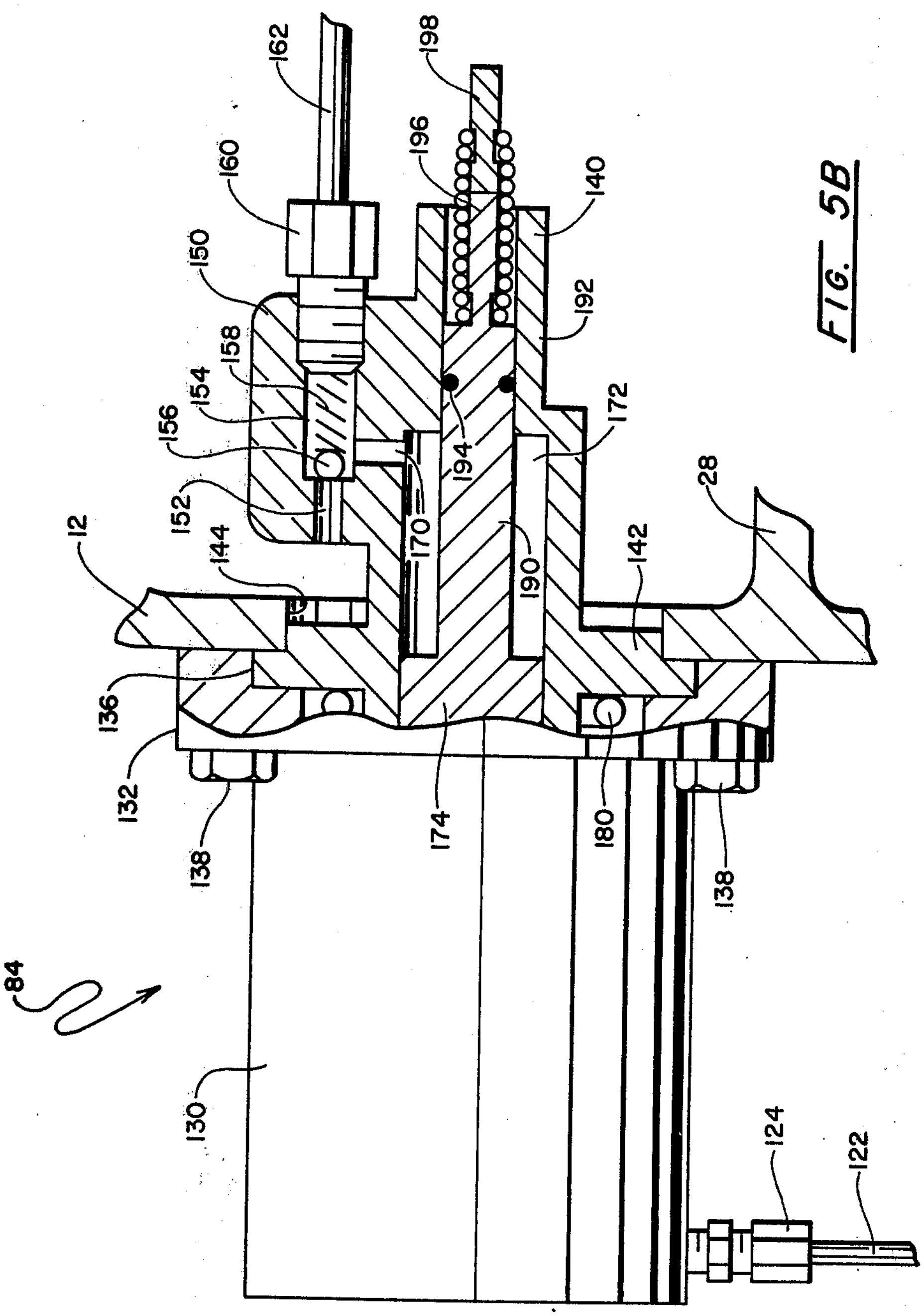
FIG. 5B is an enlarged partial and sectional view of another feature of the apparatus of the invention revealed in FIG. 5.

Looking momentarily to FIGS. 5 and 5B, it may be noted that pump body 140 is cast to provide an upwardly extending portion identified at 150. Within portion 150 is an inlet conduit or bore 152 communicating with the lubricant retained at the noted reservoir portion within upper cavity 26. Portion 150 additionally is oppositely and coaxially bored to provide a check valve chamber 154 which retains a ball 156 normally seated against the internal edge of bore or inlet conduit 152 by virtue of its association with a helical spring 158. Spring 158 extends between ball 156 and the end portion of a tube fitting 160 which is threadedly retained within a tapped bore of slightly larger diameter coaxially formed with the bore forming chamber 154. Fitting 160 connects a lubricant distribution conduit or tube 162 through another tube fitting 164 to a distributor stem component 166 of distributor 30. Note in FIGS. 5 and 5A, that fitting 164 is threadably engaged with a tapped bore formed within stem component 166 and coaxially communicates with another bore therein, 168, serving as a lubricant distribution chamber. Check valve chamber 154 of pump portion 150 communicates through a bore 170 to a pump cavity or cylinder 172 formed within pump body 140.

Looking momentarily to FIGS. 4 and 5B, it may be seen that piston 174 is configured to provide a positive displacement pump by virtue of its slideable association within cavity 172 of pump body 140. This close slideable association is assured by the presence of an O-ring 176 formed about its periphery and contacting the surface of the bore-defining cavity 172. In the drawings, piston 174 is shown in solid line fashion in its fully retracted position at which, during normal operation of the device, the cavity or cylinder 172 will have been loaded with lubricant through the port defined by bore 152, chamber 154 and the port defined by bore 170. As shown in FIG. 4, the rearward portion of piston 174 is fixed to an annular cap 178 which is relatively loosely slideable within bore 134 of pump drive cylinder 130. Positioned intermediate the inward surface of cap 178 and that portion of pump body 140 extending outwardly from flange portion 142 thereof is a helical spring 180. Note, that spring 180 abuts against the outward face of flange portion 142 and the inwardly defined face of cap 178. With this arrangement, piston 174 is normally biased outwardly in the orientation shown in solid line fashion in FIG. 4.

As is apparent, spring 180 serves as a portion of the drive arrangement for the pump, such drive arrangement also including a piston 182 slideable within bore 134 and having an annular periphery configured to retain an O-ring 184. Located outwardly of pistion 182 and within the end portion of cylinder 130 are transversely oriented bores 186 and 188. Bore 188 communicates with fitting 124 (FIG. 5) for selectively receiving and exhausting compressed gas controlled from solenoid actuated valve 82 and, ultimately derived from compressed gas source 80.

Looking additionally to FIG. 5A, the forward surface of pump piston 174 further is configured to incorporate a stem supporting portion 190 which extends through pump cavity 172 and slideably rides within the internal bore of an outer extension 192 of pump body 140. Note, that the latter bore within extension 192 communicates with lubricant within the reservoir of the apparatus and isolation between such lubricant and that within the positive displacement cavity 172 is assured both by the fit of the stem supporting portion 190 as well as an O-ring 194 positioned about the periphery thereof. Stem supporting portion 190 further extends to define a stud portion 196 of annular configuration exhibiting relatively lesser diameter. This stud portion communicates in abutting relationship with a flexible stem 198, such abutting contact being maintained by a helical closely wound spring 200 tightly wound over stud portion 196 as well as about one-half of the longitudinal extent of flexible stem 198. Annular indentations in the latter components facilitate this attachment. The reason for such flexible stem construction will be revealed in the discourse following later herein. However, the flexible stem arrangement serves a limiter function for the extent of travel of pump piston 174. With regard to effecting such extension of the piston, upon the introduction of compressed gas from source 80, solenoid control 82 and the distribution lines extending to fitting 124 (FIG. 5), such gas will be introduced through bores 186 and 188 to urge drive piston 182 to move inwardly within bore 134 to compress spring 180 and drive piston 174 forwardly. Accordingly, lubricant within cavity 172 is urged under pressure through bore 170, check-valve chamber 154, fitting 160, tube 162 and fitting 164 into chamber 168 of distributor stem component 166. During such delivery of lubricant, ball 156 is seated against the opening defined by bore 152 within chamber 154, thus sealing bore 152. The return stroke of pump piston 174 occurs with the release of compressed gas through bores 186 and 188 and, ultimately, through the relief port of solenoid actuated valve 82. With such release of compressed gas, spring 180 drives piston 140 rearwardly by virtue of its abutting contact with cap 178. As the piston moves rearwardly, lubricant is drawn from the reservoir environment through port 152, the now open check valve defined by spring 154 and ball 156 and through bore 170 to cavity 172.

Looking now to the distribution function in more detail, distributor stem component 166 is of generally cylindrical configuration and is formed having a round shaped cap 210 (FIGS. 4 and 5A) from which extends a cylindrically shaped body portion 212. Body portion 212 extends downwardly through a corresponding bore formed within the centrally disposed given axis of a distributor base member 214. The lower and outwardly disposed extent of cylindrical shaped body portion 212 is threaded to receive a nut 216.

Base member 214 is of generally annular perhipheral configuration, being formed of two radii extending from the noted axis thereof to define a peripheral flange portion 218. This flange portion 218 extends over the upward surface of web 28 of housing 12, while the lower extending annular portion of member 214 extends through a corresponding annular opening in web 28, the edge of which is revealed at 220. Member 214 is fixed to web 28 by screws as at 222 extending through bores 224 and into threaded engagement within corresponding bores within web 28. Bores 224 are revealed in the segregated top view of member 214 shown in FIG. 3, while screws 222 are further revealed in FIG. 4.

Figure 3:
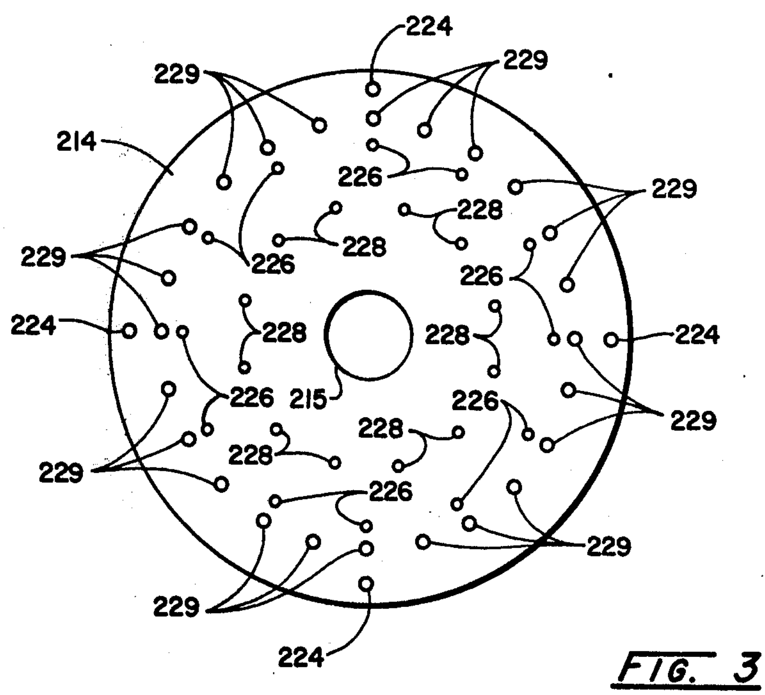
FIG. 3 is a plan view of a distributor component of the apparatus of FIGS. 1 and 2; p

As shown in FIGS. 3, 5 and 5A, distributor base member 214 incorporates the noted centrally disposed bore 215 through which distributor stem component 166 coaxially extends. The member further is configured incorporating a plurality of inlet ports 226 disposed a predetermined radial distance from the axis of bore 215. Additionally, a second plurality of such inlet ports 228 are disposed about the noted given axis at a lesser radial distance therefrom FIG. 3 further reveals that each of these inlet ports is discretely positioned with respect to a corresponding discrete and unique radius extending from the noted given central axis of bore 215. Note, in this regard, that no two of the inlet ports 226 or 228 are aligned along the same radius extending from the given axis of bore 215. Radially associated, however, with each of the discrete inlet ports 226 and 228, is a hemispherically shaped detent indentation 229, each such detent being positioned outwardly of the inlet ports 226. As particularly is revealed in the cross-sectional depiction of FIG. 5, each of the inlet ports at 226, and this configuration applies also to ports 228, is counter-bored and tapped from the underside of base member 214 to receive corresponding tube fittings, for instance, as at 230. Fittings 230, in turn, are connected with tubes or conduits 232 which extend to fittings 234, in turn, threadably coupled to correspondingly tapped bores formed within the side walls of housing 12 extending through lower cavity 66. These tapped bores, as exemplified at 236, additionally receive fittings 238 extending thereinto from the outwardly disposed side of housing 12. Intermediate each of the fitting pairs 238 and 234 and formed within tapped bore 236, is a check-valve assembly including, for instance, a helical spring 240 and ball 242. The springs as at 240 are disposed so as to normally urge an associated ball 242 into a seated configuration against the outlet of fitting 234. Each externally disposed fitting 238, in turn, connects a tube-type distribution conduit 234 to a preselected lubrication site, for instance, located at a so designated point within the chassis of a truck or within other machinery sought to be lubricated. Note, that in the arrangement shown, twenty-four such sites are serviced. As will be apparent as the description unfolds, a greater or lesser number of such sites may be accommodated by the device, for instance, one model of the apparatus serves to service forty-eight lubrication sites as at 246 (FIG. 1). The particular interconnection between tubes or conduits 244 and such sites 246 is not revealed in detail, it being within the purview of those skilled in the art to provide an appropriate fitting. Of course, the check-valves as are provided at bores 236 may be located at other points within the distribution conduit networks, however, for mounting and manufacturing ease and simplicity, the location shown is considered preferable.

FIGS. 4, 5 and 5A also reveal a distributor selector member 250 of annular peripheral configuration and centrally bored at 252 so as to receive, in close fitting relationship, the cylindrically shaped body portion 212 of distributor stem component 166. As is revealed in FIGS. 5 and 5A, member 250 is arranged to rotate about body portion 212 of stem component 166 and the lower surface thereof slides in close adjacency over the upwardly disposed surface of base member 214. Member 250 is formed having a radial bore 254 which extends to axially aligned transversely disposed bores 256 and 258. Within each of these bores 256 and 258 is disposed a plastic insert shown, respectively, at 260 and 262, each of which is centrally bored. Inserts 260 and 262 additionally are formed having somewhat centrally disposed grooves over each of which is positioned respective O-rings 261 and 263. Additionally, the noted inserts are configured to extend slightly below the lower surface of member 250 and are slightly beveled to define a nozzle-type outlet. Note, additionally, that the upward extent of the inserts 260 and 262 is limited to provide a lubricant conveying communication of their centrally disposed bores with radial bore 254. Preferably, inserts 260 and 262 are fashioned of a plastic which is immune from reaction to typical lubricants such as grease. Accordingly, the inserts are formed, for instance, of nylon.

Radial bore 254 is vertically positioned so as to communicate with a corresponding slot or channel 264 formed within distributor stem component 166. Additionally disposed on each side of slot 264 are annular v-shaped grooves within which are positioned O-rings 266 and 268.

The central bores of inserts 260 and 262 are radially positioned from the noted given axis of both stem portion 166 and distributor selector member 250 so as to be selectively alignable with one given inlet port 226 or 228. Recall that these inlet ports are each positioned upon a unique radius of member 214. Accordingly, as distributor-selector member 250 is rotated from one select position to another, one or the other of the central bores of inserts 260 and 262 will be in lubricant conveying alignment with a given input port. That insert 260 or 262 centrally disposed bore not so aligned will be blocked by virtue of its abutment against the upward surface of base member 214. With the distribution arrangement shown, lubricant under pressure from the pumping function passes along conduit or tube 162, through fitting 164 into chamber 168. From chamber 168 it is delivered from radial bore 270 into chamber or slot 264 where it is isolated by O-rings 266 and 268. Accordingly, the lubricant is passed through bore 254 whereupon it addresses the central bores of inserts 260 and 262. That central bore of a given insert 260 or 262 which is aligned with one select and discrete inlet port 226 or 228 will transfer the lubricant into an appropriate conduit 232 through fitting 230 for ultimate delivery to a lubrication site. It further should be apparent, that the check-valve within the bore 236 through which the lubricant is thus conveyed serves to prevent reverse lubricant transmission occassioned by the pressures developed in a delivery conduit 244.

Another aspect of the operation of selector member 250 and base member 214 resides in the lubricant pressure intermediate an associated port 226 or 228 and respective central base of insert 260 and 262 as such pressure exists just following the delivery of lubricant therethrough. Back pressures within an associated conduit or tube as at 232 extending to a check valve fitting may be witnessed at the noted port association, i.e. such as that shown in FIG. 5A between port 226 and the base of insert 260. Inasmuch as such back pressure may hinder the rotational movement of selector member 250, the diameter of the base of the inserts as at 260 are selected to be larger than the diameter of ports as at 260. For instance, the diameter of ports 226 or 228 may be selected as 0.040 inch, while that of the bores of inserts 260 and 262 may be selected as 0.062 inch.

The alignment of distributor-selector member 250 requisite to provide the noted distribution of lubricant is assured by virtue of a detent arrangement including bore 272 a given hemispherical shaped detent 229, ball 274 and spring 276.

As shown additionally in FIG. 4, distributor-selector member 250 carries a bell-shaped ratchet 282 and a cam 284. In this regard, bell-shaped ratchet 282 is configured having a central opening through which body portion 212 of distributor stem component 166 is inserted. Additionally, cam 284 is formed having a central opening, the periphery of which is identified at 286, within which the round cap 210 of stem 166 is located. Both the ratchet 282 and cam 284 are secured to distributor-selector member 250 by machine screws 288 (FIG. 4). Ratchet 282 is formed having peripherally disposed teeth 289 in a number corresponding with the number of ports 226 and 228 provided in selector member 250. Thus configured, ratchet 282 serves as a component within the distributor-actuator arrangement alluded to earlier at block 86.

Now addressing that component of the invention and looking to FIGS. 4 and 5, the distributor-actuator function 86 serves to selectively cause the distributor-selector member 250 to index between successive orientations wherein one or the other of the internal bores of inserts 260 and 262 is positioned in alignment with one discrete inlet port 226 or 228. To assure proper positioning as part of the process, the detent arrangement, including ball 274 and detent indentation 229, are provided. However to impart adequate rotational movement to index from one successive inlet port to the next, function 86 serves to successively operate upon the ratchet teeth 288 of bell-shaped ratchet 282 to provide that "gross" manipulation or orientation of the device which then is perfected in a "vernier" movement through the utilization of the noted detent indentations 229. The function 86 includes a drive assembly comprising an end cap 296 which incorporates a port formed as a bore which is threadably tapped to receive fitting 112 (FIGS. 2 and 5) for receiving and releasing compressed gas. End cap 296 is retained in position upon the surface of housing 12 adjacent the noted upper cavity 26 by machine screws 300. Cap 296 secures a drive cylinder 302 in properly aligned positon against the wall of housing 12. Note, in this regard, that cylinder 302 is formed having an exterially disposed flange portion 304 incorporating an O-ring 306 which nests against a corresponding bore in end cap 296 and is held, as noted above, in adjacency against housing wall 12. Accordingly, the remainder of the cylinder 302 protrudes through a corresponding annular opening in housing 12 at a location properly aligned to permit its actuation of the distributor function by coaction with the bell-shaped ratchet 282. The fit between cylinder 302 and housing 12 is such as to insure the lubricant retaining integrity of the reservoir of which upper cavity 26 is a portion. Cylinder 302 is internally bored to provide a first cylindrical cavity 305 within which a piston 308 is slideably retained. To accommodate for acceptable manufacturing tolerances, piston 308 includes a peripherally disposed O-ring 310. Cylindrical cavity 305 terminates at an annular shoulder defining portion 312, from which a cavity of lesser diameter is provided, as at bore 314. The cylinder opens freely into the lubricant environment of the reservoir through somewhat enlarged opening 316.

Somewhat loosely retained within cavities 305 and 314 is a T-shaped drive member shown generally at 318 comprising a stem portion 320 which is bifurcate in form, the bifurcate portion terminating in a tip having a pin 322 extending therethrough. The opposite side of stem portion 320 terminates in an annular flange or shoulder portion 324 fixed thereto and oriented normally to the axis of the stem portion. Confined between the shoulder portion 324 and the terminus of cavity 314 is a helical spring 326. Spring 326 is of a diameter selected such that when fully compressed, it is confined within bore or cavity 314. On the opposite side of freely slideable piston 308 and extending through cap 296 is a spacer formed as a threaded rod 328 extending through a bore in cap 296 and locked in position by a nut 330.

In operation, with the introduction of compressed gas through bore 298, piston 308 is driven forwardly within cylinder 302. With the drive motion of piston 308, flange portion 324 is engaged by the forward surface of the piston and driven forwardly while compressing spring 326 until the shoulder portion at the periphery of flange 324 engages the platform defined at 312. This engagement serves to properly align the stem portion 320 of the drive member 318 such that pin 322 will engage an adjacent tooth at 289 upon reverse or reciprocal motion of the stem imparted from spring 326. Pin 322 is properly aligned for the subsequent engagement in consequence of the sliding association of the bifurcate portion of stem 320 with the periphery of ratchet 282. This engagement is revealed in FIG. 5. Because drive member 318 is relatively loosely contained within cylinder 302, it will accommodate to slight variations required to provide proper engagement in movement. Accordingly, an important advantage in operational reliability is gained. Note, in FIG. 4, that drive member 318 may move for instance, to orientations as revealed in phantom at 318'; but eventually will return to a proper orientation for ratchet engagement once shoulder portion 324 engages platform portion 312.

Another important aspect of the design of the drive actuator arrangement resides in the technique for imparting reverse motion to drive member 318. When the orientation of pin 322 is assured for engagement with an appropriate tooth 289, the driveforce of spring 326 causes driving engagement between pin 322 and such tooth to rotate ratchet 282 and, in consequence impart rotative motion to distributor selector member 250 as well as cam 284. Should a compressed gas driven arrangement have been provided for this activity, the forces applied in moving distributor-selector 250 would be such as to tend to damage teeth 289. However, through the use of spring driven force at this juncture, a relatively gently applied but effective drive force is asserted to assure the long term reliability of this function of the system.

Returning now to lubricant pump function 84, the performance of flexible stem 198 within the pumping arrangement may be disclosed. Looking to FIG. 4, it may be observed that stem 198 is aligned coaxially with the given axis of the distributor arrangement 30 and, in consequence, with the axis of cam 284. Note that cam 284 is formed having predetermined geometric characteristics which include profile portions 338, 340 and 342. Accordingly, when compressed gas is introduced through port 188 and stud portion 196 is driven outwardly, the extent of such outward travel will be limited as the abutting end tip of stem 198 engages that cam profile portion 338–342 aligned in its path of travel. By adjusting these profile portions, the amount of lubricant delivered to given inlet ports 226 or 228 of base member 214 may be predetermined in accordance with that amount of lubricant desired for a particular series of lubrication sites 246. As cam 284 rotates in conjunction with bell-shaped ratchet 282 as well as distributor-selector member 250, these select profile portions will move with respect to flexible stem 198. As the rising profile portions of the cam are encountered, however, it is possible that a frictional engagement between stem 198 and such rising profile would create a binding-type hindrance of the operation of the lubricant pump. To accommodate for such a possibility, the earlier-discussed flexible mounting of stem 198 assures that no such binding can occur. In FIG. 4, the location of pump piston 174 during outward travel at just such an operational condition is shown in phantom, for instance, at 174'. Additionally, the extent of forward travel of flexible stem 198 is shown at 198' under a condition where the stem otherwise would interfere with rising profile portion 344 of the cam. Note, that the stem at 198' is shown flexing to an askew orientation to avoid any binding influence with rising profile portion 344. This important feature of the apparatus assures long term reliable performance of the lubricating system.

Looking now to the operation of the apparatus, with an actuation of solenoid driven valve 188, for instance for a relatively short period of about 4–6 seconds, compressed gas is introduced from source 80 through the valve and T-connector 90 for simultaneous introduction along the earlier described tubes or conduits to the inlets at 112 and 124 of drive cylinder 130 of pumping function 84 and input port 298 of actuator function 86. As a consequence, piston 308 of the latter is driven forwardly to drive T-shaped drive member 318 into an extended orientation properly aligned with respect to a given tooth 289 of bell-shaped ratchet 282. Simultaneously, piston 182 of drive cylinder 130 is driven forwardly to, in turn, drive pump piston 174 forwardly until flexible stem 198 abuts an appropriate profile portion of cam 284. As this occurs, lubricant is delivered through conduit 162 and through the earlier-noted paths into an appropriate inlet port 226 or 228 of distributor base member 214. From that selected port, the lubricant is delivered under pressure through conduits 232, the check valves within tapped bore 240 and conduits 244 to the lubrication site. Following such delivery, any back pressure is accommodated for inter alia, by the earlier-described check valve within bore 240. Following the noted energization or actuation interval at solenoid 88, the compressed gas delivered through T-section 90 is released to permit spring 180 to return pump piston 174 to its initial position and, simultaneously, reload pump cavity or cylinder 172 with lubricant through inlet bore or port 152. The relief of the compressed gas also permits spring 322 within drive cylinder 302 to drive T-shaped drive member 318 to its initial position and incrementally rotate ratchet 282 to its next operational orientation. Simultaneously, cam 284 is indexed to its next appropriate orientation. Following a select longer interval, for instance of about 6 minutes, depending upon the operational requirements of the machinery being lubricated, the process is repeated.

As discussed above, no compression is applied to the lubricant within the reservoir of the apparatus. Such compression is not required inasmuch as the above-described driving components including stem 320, flexible stem 198, cam 284 and ratchet 282 are in periodic motion. This motion imparts a shear to the lubricant in the vicinity of the input port 152 of the pump function 84. Accordingly, the lubricant is readily introduced without problems of cavitation and the like otherwise encountered with such an arrangement.

Another highly advantageous aspect of the system thus disclosed resides in an inherent self-lubrication of the solenoid actuated valve 88 as well as the various mechanical components of the system. Note, for instance, that all of the moving parts are within the environment of the lubricant itself. Additionally, it has been observed that a small amount of lubricant gradually migrates through cavity 305 of drive cylinder 302, fitting 112, tube 110, fitting 108, fitting 106, tube 104, fitting 102 and T-connector 90. From T-connector 90, such small amount of lubricant progresses into the moving components of the valve at 88 to assure the lubrication thereof and continues migration through fitting 114, conduit 116, fitting 118, fitting 120 conduit 122 and fitting 124 to the input ports 186 and 188 of pump drive cylinder 130. Accordingly, bore 134 and the components moving therewithin additionally are continually lubricated with a small and appropriate amount of the lubricant deriving ultimately from the reservoir portion of the apparatus. This small amount of lubricant is that which gradually moves as a film across the O-ring connection 310 of piston 308. With the arrangement, a continuous, advantageous lubrication of all significant moving parts of the entire apparatus is realized. Additionally, as noted earlier, the top level 20 of the lubricant is vented in contamination free fashion by vent tube 60.

Figure 7:
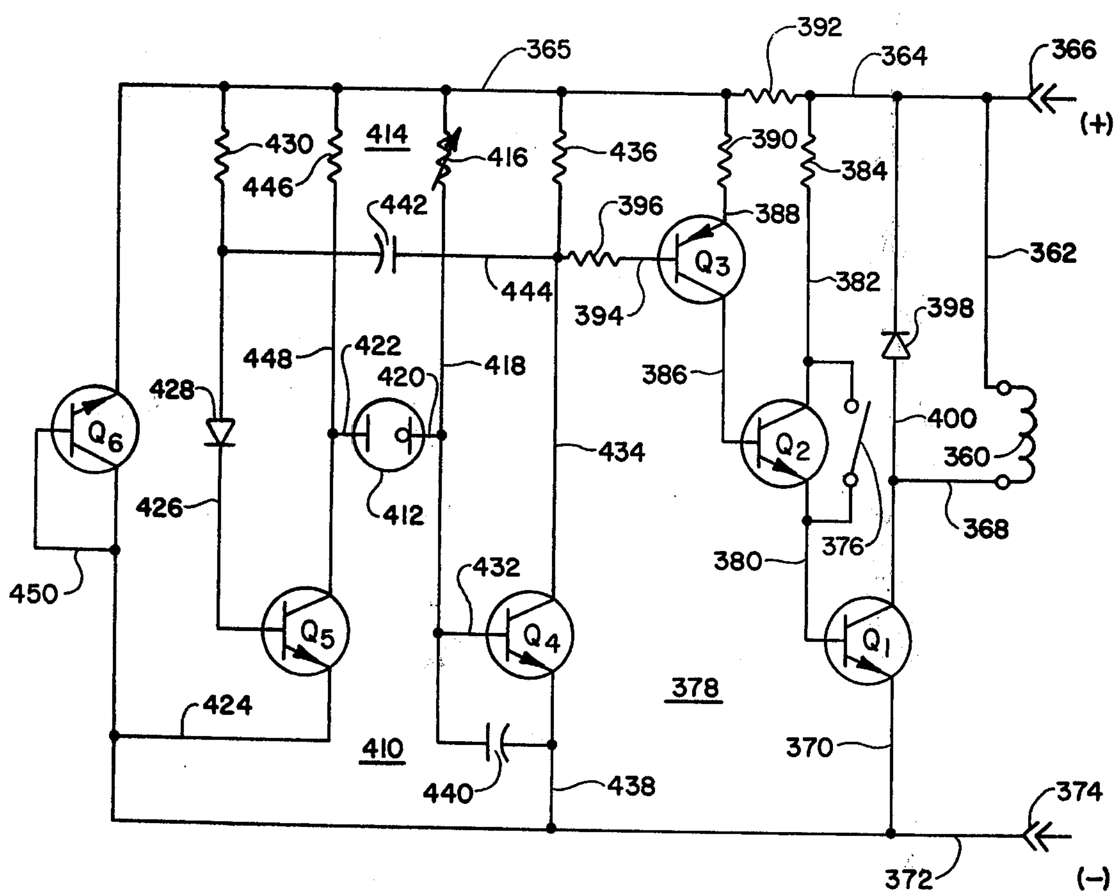
FIG. 7 is a schematic diagram of a timing circuit utilized within the system of the invention.

Turning to FIG. 7, the circuit diagram for a timing device suited for periodically energizing the winding of solenoid control 82 is revealed. As noted earlier herein, this timing device also must exhibit characteristics of reliability commensurate with those of the mechanical components of the system. Without such corresponding reliability of performance, the reliability of the entire system would exhibit that reliability of its weakest component. Looking to the figure, the inductive load represented by the winding of solenoid actuated valve 88 is shown at 360. One side of winding 360 is connected by lead 362 to a first power lead identified at 364 and 365. Power lead 364, in turn, is coupled with the positive designated side of a power supply, for instance, that of the tractor component of a vehicle within which the system may be mounted. Such coupling is represented schematically at 366. The opposite side of winding 360 is coupled through lead 368 to the collector of an NPN power transistor, $Q_1$. The emitter of transistor $Q_1$ is coupled through line 370 to a second power lead 372. Lead 372 is connected, for instance, through a coupling indicated at 374 to that side of the power supply of the noted vehicle having a "negative" polar designation.

Power transistor $Q_1$ represents the output stage of a switching network designated generally at 378. Network 378 further includes NPN transistor $Q_2$ the emitter of which is coupled through line 390 to the base of transistor $Q_1$. The collector of transistor $Q_2$ is connected through line 382 and load limiting resistor 384 to power lead 364. A by-pass switch 376 is shown connected across the emitter and collector of transistor $Q_2$. The input stage to network 378 is present as a PNP transistor $Q_3$, the collector of which is coupled through line 386 to the base of transistor $Q_2$ and the emitter of which is connected through line 388 and current limiting resistor 390 to power lead 364. Note, that between line 364 and 365 a current limiting resistor 392 is provided which serves as a current limiting device for the entire circuit. This resistor will be observed to cooperate with a voltage regulating device later to be described. The input to network 378 is present at line 394, incorporating bias resistor 396. With the switching arrangement shown, it will be apparent that, as transistor $Q_3$ is drawn into conduction, the base-emitter junction of transistor $Q_2$ is forwardly biased, to, in turn, assert a forward biasing condition to the base-emitter junction of power transistor $Q_1$. In consequence, current is permitted to pass through inductive winding 360. Conversely, with the turning off of transistor $Q_3$, transistors $Q_2$ and $Q_1$ simultaneously are turned off to discontinue current flow through winding 360. Inductive load 360 performs in conventional solenoid driving fashion and is characterized in the development of a reverse current surge phenomena. One aspect of the regulation of this condition, otherwise deleterious to the remaining portions of the circuit, is provided by a diode 398 coupled within line 400 across the winding between power lead 364 and line 368. Coupled as shown, the diode transmits reverse voltages incurred from the inductive load performance described.

The circuit of FIG. 7 also incorporates a logic network shown generally at 410. It is the purpose of this logic network to establish the predetermined periodic schedule of energization of winding 360. For example, as noted above, for tractor-trailer vehicle utilization of the system, it may be desirable to actuate the lubricant dispensing components for a relatively short or set interval of about 4–5 seconds, following which a readout or dwell phase or interval of about 6 minutes occurs pending the next energization of the solenoid winding. While the shorter energization interval normally will be consistent, inasmuch as the period required to effect lubrication generally is a consistent one, the longer dwell interval may be varied to meet corresponding variations in road and climatic conditions for the exemplary utilization of the system described herein. Timing logic network 410 includes a first transistor stage present as NPN transistor $Q_4$, a second NPN transistor stage, $Q_5$ and an electro-chemical timing device or component 412 operatively associated therebetween. Additionally operating within the network 410, is an R-C timing network, shown generally at 414. Electro-chemical timing device 412 is one operating on a plate-deplate principle and exhibiting, from an initial condition, a conductive state over a predetermined first interval upon the passage of a predetermined amount of current therethrough in a designated first directional sense and further exhibits a substantially non-conductive state to the current of first directional sense at the termination at that noted interval. The device is responsive to the passage of current of predetermined value therethrough in a second directional sense to transition from the non-conductive state to the initial condition within a predetermined second interval. Such devices are marketed under the trade designation "E-CELL" a trademark of Bissett-Berman Corporation, 3860 Centinela Avenue, Los Angeles, Calif. 90066. For further details concerning such devices reference is made to U.S. Pat. Nos. 3,423,643; 3,423,644; and 3,423,648.

Timing device 412 operates as a resistive element. During a time delay phase of its operation, such delay is controlled by an initial quantity of platable material on its anode and the operating current passing therethrough to achieve a plate-out mode. During such a timing or plating interval, the timing device 412 exhibits a relatively low resistance to current passing therethrough in a plating, i.e. first directional sense. Assuming such interval to be underway in network 410, current of a first directional sense passes through line 418, variable resistor 416, line 420, device 412, line 422, transistor $Q_5$ and line 424 to lead 372. As is apparent, transistor $Q_5$ must be forward biased for this current flow to occur. In this regard, note that the base thereof is coupled through line 426, including diode 428 and timing resistor 430, to power lead 365. During this plating interval, the resistance exhibited by device 412 is relatively low, and, accordingly, current otherwise turning on transistor $Q_4$ through line 432 is diverted. The collector of transistor $Q_4$ is coupled through line 434 to line 394 incorporating resistor 396 and attached to the base of transistor $Q_3$ of switching network 374. Line 434 also extends through resistor 436 to power lead 364. The emitter of transistor $Q_4$ is connected through line 438 to second power lead 372, and a protective or buffering capacitor 440 is connected within line 418 between the base of the transistor and the emitter thereof. When transistor $Q_4$ is not conducting, transistor $Q_3$ of switching network 378 is off to, in turn, derive an off status at power switching transistor $Q_1$. Accordingly, winding 360 is not energized during this interval.

Following a predetermined de-plating interval, as established by the value of resistance provided at variable resistor 416, the resistance exhibited by device 412 rises to the extent that the device exhibits essential non-conductivity to the flow of current in the first directional sense through resistor 416 lines 418 and 420. At this occurs, forward bias then is asserted from line 418 as the base-emitter junction of transistor $Q_4$ to turn that transistor on. As transistor $Q_4$ turns on, it in turn, draws on transistor $Q_3$ to ultimately turn on power transistor $Q_1$ and energize winding 360 of the solenoid. As transistor $Q_4$ turns on, timing capacitor 442 within the earlier noted R-C timing network 414 and formed within line 444 discharges through conducting transistor $Q_4$. Inasmuch as line 444 is coupled with line 426, the forward bias otherwise asserted at transistor $Q_5$ is removed and transistor $Q_5$ turns off. As transistor $Q_5$ turns off, current is permitted to flow in a second directional sense through resistor 446 and line 448 into timing device 412. Accordingly, a replate function or operation occurs, the rate of which is determined by the value of current flow therethrough established at resistor 446. This rate is selected so as to return device 412 to its initial plate condition within the predetermined interval selected for achieving energization of inductive winding 360. This interval is regulated by R-C timing network 414 including the above-described capacitor 442 operating in conjunction with resistor 430. Within, for instance, the 4–5 second predetermined interval, capacitor 442 is observed to assume a negative condition and gradually recover to assert a gradually rising voltage value at line 426, this voltage value reaching the threshold or triggering value requisite to forward biasing transistor $Q_5$ at the termination of the noted 4–5 second or predetermined interval. As this occurs, transistor $Q_5$ conducts to cause timing current to flow through timing device 412 from resistor 416 and through lines 418 and 420, as earlier described in connection with the dwell or readout phase of its operation. As the resistance of device 412 drops to permit its assumption of a substantially conductive state, the forward bias asserted otherwise as the base-emitter junction of transistor $Q_4$ is removed or shunted and transistor $Q_4$ turns off. As above described, this, in turn, effects the turning off of power transistor $Q_1$ to terminate current flow through inductive winding 360.

As discussed above, the reliability of the overall lubricating system requires that all components thereof individually exhibit high reliability characteristics, the weakest link within the system essentially defining the reliability of the entire system. As those skilled in the art are readily aware, the switching of current into and away from an inductive load characteristically derives reverse current surges or voltages which, when imposed upon conventional solid state logic components, may disrupt their proper logic conditions to render the system inoperative or unreliable. To accommodate for such voltage surges, a transistor stage present as a NPN monolithic transistor $Q_6$ is connected between the first power lead 365 and second power lead 372. Note that the emitter of transistor $Q_6$ is coupled with line 365, while its collector is connected with line 372. Additionally, a line 450 connects the base of transistor $Q_6$ with line 372. Operating in conjunction with earlier-described resistor 392, transistor stage $Q_6$ serves to protect the logic components of the circuit from the noted voltage surges. In this regard, as a voltage surge of polarity opposite that normally extant at line 372 is imposed thereacross, it serves to forward bias the base-emitter junction of transistor $Q_6$. Accordingly, the polar sense of such voltage surge is imposed uniformly from both lines 365 and 372. In consequence, no deleterious voltage drops are presented at logic network 410 and the network thereby is protected. During normal operation of the circuit without the presence of such surges transistor stage $Q_6$ reacts as a zener diode providing voltage regulation within the system. Resistor 392 will be observed to provide protection for transistor stage $Q_6$.

Capacitor 440, connected between the base and emitter electrodes of transistor stage $Q_4$, serves to hold transistor $Q_4$ on in the presence of spurious signals generated during the performance of network 410, thereby additionally enhancing the reliability of operation of logic network 410.

Inasmuch as it is desirable to provide a facility for manually effecting an energization of winding 360, earlier described switch 376 is provided. As is apparent, a temporary closure of the switch will actuate the lubrication system. This feature may be utilized, for instance, for purposes of initially priming lubricator 10 or for desired testing thereof.

Since certain changes may be made in the above-described system and apparatus without departing from the scope of the invention herein involved, it is intended that all matter contained in the above description of shown in the accompanying drawings shall be interpreted as illustrative and not in a limiting sense.

I claim:

1. A timing device for periodically energizing a load from a source comprising:

switching means responsive to a given input signal for effecting the energization of said load from said source;

logic network means including:

an electrochemical timing device exhibiting, from an initial conductive condition, a conductive state over a predetermined first interval upon the passage of a predetermined value of current there through in a designated first directional sense and exhibiting a substantially non-conductive state to said current of first directional sense at the termination of said interval, said device being responsive to the passage of current of predetermined value there through in a second directional sense to transition from said non-conductive state to said initial state within a predetermined second interval, a first transistor stage operatively associated with said switching means and said timing device and having a conducting mode deriving said switching means input signal when said timing device is in said non-conducting state, and having a non-conducting mode when said timing device is in said conductive state, a second transistor stage operatively associated with said timing device and responsive to a given input signal to exhibit a conducting mode effecting said current passage in said first directional sense to derive said timing device conductive state and having a non-conducting mode during said passage of current of second directional sense through said timing device; and R-C timing network means for deriving said given input signal to said second transistor stage at the termination of a predetermined second interval commencing with the termination of said first interval.

2. The timing device of claim 1 including capacitor means coupled with said first transistor stage for effecting the maintenance of said conducting mode in the presence of spurious voltage excursions within said logic network means.

3. The timing device of claim 1 including:

first and second power leads connectable with said source and wherein;

said switching means is coupled with one said power lead and includes an output connectable with said load and another said power lead;

said logic network means is connected between said first and second power leads; and voltage regulating means including a transistor stage having the emitter thereof coupled to said first power lead of one designated polarity, and the base and collector thereof directly coupled together and to said second power lead of designated polarity opposite said one polarity, and current limiting resistor means coupled in series circuit relationship with one said power lead, said transistor stage being responsive to a transient voltage at said second power lead of said one designated polarity, derived from said load, to transmit said transient voltage to said first power lead, whereby any deleterious voltage drops occasioned by the presence of said transient voltage are substantially diminished.

4. The timing device of claim 3 in which said transistor stage comprises a monolithic NPN transistor.

5. The timing device of claim 3 in which said current limiting resistor is incorporated within said one power lead at a location intermediate said load and said logic network means connection with said one power lead.

* * * * *